US005694282A

United States Patent [19]
Yockey

[11] Patent Number: 5,694,282
[45] Date of Patent: Dec. 2, 1997

[54] SHORT CIRCUIT PROTECTION SYSTEM

[75] Inventor: Karienne Ann Yockey, Farmington Hills, Mich.

[73] Assignee: Ford Motor Company, Dearborn, Mich.

[21] Appl. No.: 610,507

[22] Filed: Mar. 4, 1996

[51] Int. Cl.⁶ .................................................. H02H 3/18
[52] U.S. Cl. ............................. 361/86; 361/101; 361/159
[58] Field of Search .............................. 307/10.7, 100, 307/116, 130, 131; 361/56, 86, 87, 92, 111, 159, 101

[56] References Cited

U.S. PATENT DOCUMENTS

| | | |
|---|---|---|
| 3,967,207 | 6/1976 | Wheatley, Jr. . |
| 4,291,357 | 9/1981 | Hong .................................... 361/101 |
| 4,355,344 | 10/1982 | Felici et al. ........................... 361/103 |
| 4,492,213 | 1/1985 | Yamamoto et al. .................. 123/64 |
| 4,520,418 | 5/1985 | Susi ...................................... 361/92 |
| 4,555,742 | 11/1985 | Gray et al. ........................... 361/93 |
| 4,612,638 | 9/1986 | Kissel .................................. 371/15 |
| 4,695,915 | 9/1987 | Mahalek et al. ..................... 361/56 |
| 5,373,826 | 12/1994 | Taruya et al. ....................... 123/644 |
| 5,510,950 | 4/1996 | Bills et al. ........................... 361/93 |

Primary Examiner—Jeffrey A. Gaffin
Assistant Examiner—Michael Sherry
Attorney, Agent, or Firm—Mark S. Sparschu

[57] ABSTRACT

In one embodiment of the present invention, across an electrical load to prevent over dissipation semiconductor switch in the event of a short circuit. The system includes a microprocessor with a terminal which is alternatively configurable as an input and as an output. When the terminal is configured as an output, the microprocessor can turn the electrical load ON and OFF via a transistor, under software control. Once the microprocessor turns the load ON, the microprocessor reconfigures its terminal to be an input. The system automatically latches the electrical load ON until a short circuit occurs or until the microprocessor turns the load OFF. When a short circuit occurs, the system automatically turns the load OFF. With the microprocessor terminal configured as an input, the microprocessor can detect when the system has automatically turned the load OFF due to a short circuit, thus being able to set a diagnostic code or take other appropriate action. A low-pass filter can be added between the microprocessor terminal and the transistor, reducing the inductive voltage spike which may occur when the load is turned OFF.

17 Claims, 1 Drawing Sheet

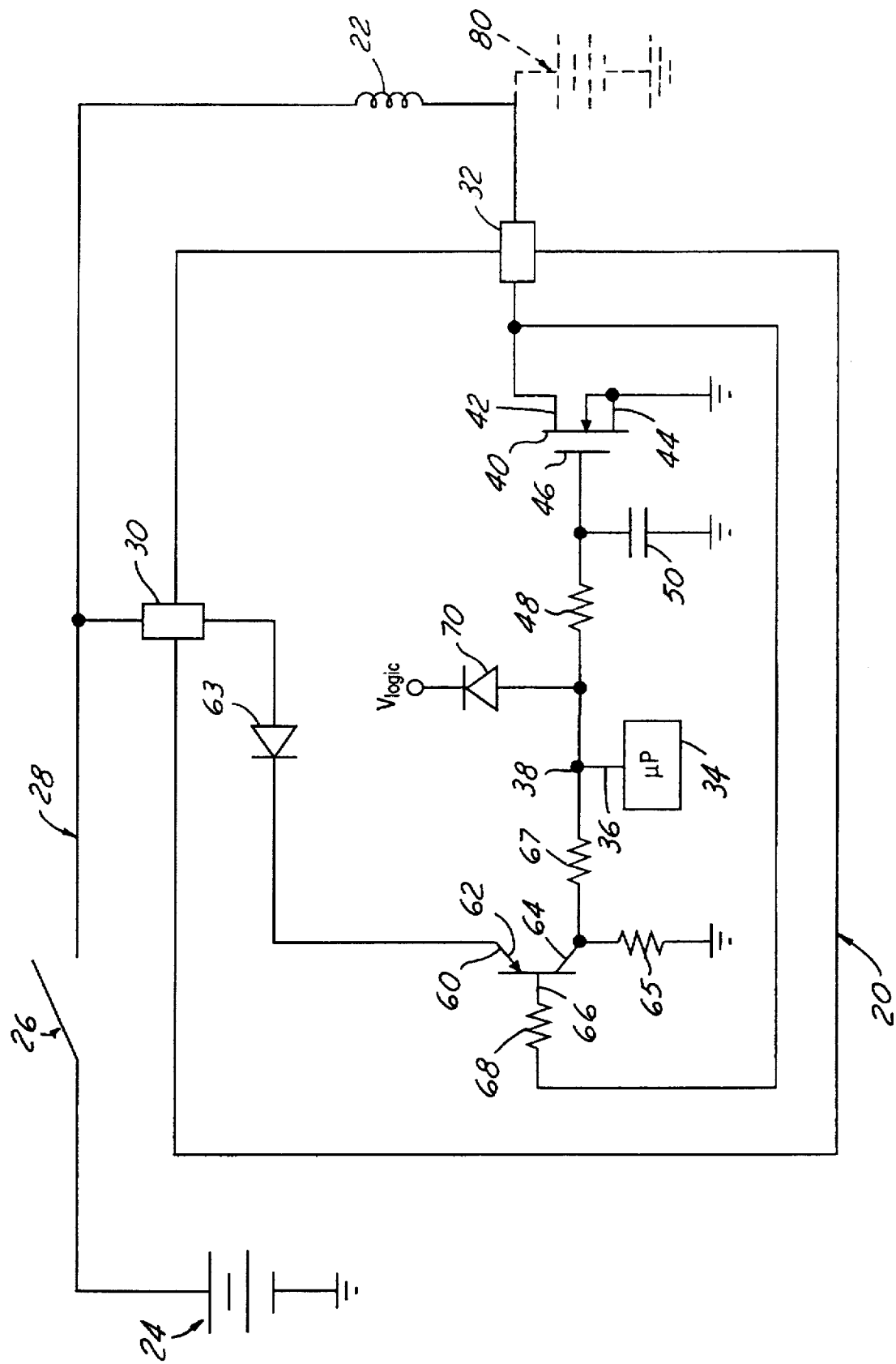

SHORT CIRCUIT PROTECTION SYSTEM

BACKGROUND OF THE INVENTION

1. Field of the Invention

The present invention relates to fault protection mechanisms for electronic systems.

2. Description of the Related Art

In the control of an electrical component, a semiconductor switch such as a transistor can be used. A semiconductor switch will typically controllably transform between a conducting and a non-conducting state to turn the electrical component ON and OFF, respectively.

One concern in the control of electrical components is in short circuit protection of the semiconductor switches involved. Consider, for example, if a semiconductor switch is used at the low side of an electrical component (that is, if the electrical component is "pulled up" to a supply voltage). An inadvertent short circuit to the supply voltage which occurs at the low side of the electrical component can cause the semiconductor switch to "overdissipate" when the semiconductor switch turns ON. Such overdissipation would occur due to the semiconductor switch trying to pull to ground the low-source-impedance short circuit to supply voltage. The result can be greatly excessive power dissipation within the semiconductor switch, potentially damaging or destroying the semiconductor switch.

One short circuit protection system is disclosed in U.S. Pat. No. 4,555,742, issued to Gray et. al. Although the system of the '742 patent may be generally effective, the system can be improved upon in a number of ways. First, the system of the '742 patent is relatively complex. Also, the system of the '742 patent requires the addition of a resistor in series with the electrical load in order to detect a short circuit condition. Such a series resistor can adversely affect the performance and efficiency of the electronic system which is being protected.

An additional feature which can be advantageous in an electrical system is "flyback protection." Flyback protection refers to preventing damage to components, such as a semiconductor switch, when an inductive load is turned from its ON state to its OFF state. Those skilled in the art readily recognize that when an inductive load is turned OFF, especially when the load is turned OFF quickly, an inductive voltage spike appears across the load. Such an inductive voltage spike has the potential to damage or destroy a semiconductor switch coupled to the inductive load.

Thus, a system which provides effective short circuit protection with minimal complexity and without the requirement for a resistor in series with the electrical load being controlled will provide advantages over the prior art. Additionally, further advantages can be obtained if such a system can provide flyback protection in the event that the electrical load is an inductor.

SUMMARY OF THE INVENTION

The present system provides a short circuit protection system. The system comprises a first terminal and a second terminal. The system also includes a first transistor coupled to the second terminal, the first transistor having an OFF state in which substantially no current flows in series through the second terminal and the first transistor and an ON state in which current flows substantially in series through the second terminal and the first transistor. The system additionally comprises a microprocessor having a microprocessor terminal configurable as an output and alternatively configurable to have a high-impedance state, wherein the first transistor is controllably coupled to the microprocessor terminal. Further, the system includes a second transistor coupled substantially across the first and second terminals and further controllingly coupled to the first transistor, whereby the second transistor is responsive to a voltage across the first and second terminals to force the first transistor OFF if the voltage across the first and second terminals is less than a predetermined value, the first transistor is ON and the microprocessor terminal is configured to have the high-impedance state, and to hold the first transistor ON if the voltage across the first and second terminals is greater than the predetermined value, the first transistor is ON and the microprocessor terminal is configured to have the high-impedance state.

The present invention further provides a second short circuit protection system. The system comprises an electrical load and a first transistor coupled to the electrical load, the first transistor having an OFF state in which substantially no current flows through the electrical load and an ON state in which current flows substantially in series through the electrical load and the first transistor. Also, the system comprises a microprocessor having a microprocessor terminal configurable as an output and alternatively configurable to have a high-impedance state, wherein the first transistor is controllably coupled to the microprocessor terminal. In addition, the system comprises a second transistor coupled substantially across the electrical load and further controllingly coupled to the first transistor, the second transistor responsive to a voltage across the electrical load to force the first transistor OFF if the voltage across the electrical load is less than a predetermined value, the first transistor is ON and the microprocessor terminal is configured to have the high-impedance state, and to hold the first transistor ON if the voltage across the electrical load is greater than the predetermined value, the first transistor is ON and the microprocessor terminal is configured to have the high-impedance state.

Systems according to the present invention can provide effective short circuit protection and can do so with minimal complexity and without the requirement of a resistor in series with the electrical load. Further, in some embodiments of the present invention, flyback protection prevents excessive voltage spikes in the event that the load has an impedance with a significant inductive component.

BRIEF DESCRIPTION OF THE DRAWINGS

The FIGURE is an electrical schematic of a short circuit protection system according to one embodiment of the present invention.

DETAILED DESCRIPTION OF THE PREFERRED EMBODIMENT

Referring to the FIGURE, a system according to one embodiment of the present invention will be described. The system includes a controller 20 which is adapted to control an electrical load 22. As will be described, systems according to the present invention can be used to particular advantage if the electrical impedance of electrical load 22 has a significant inductive component. A solenoid is one such electrical load.

The system includes a source of electrical power such as a battery 24, which is coupled to controller 20 and electrical load 22 via a switch such as ignition switch 26 of a motor vehicle. Circuit 28 thus has a nominal voltage of 12 volts DC when ignition switch 26 is closed.

Controller 20 has terminals 30 and 32. Terminal 30 is coupled to circuit 28, while terminal 32 is coupled to the low side of electrical load 22, to switchably control the current through electrical load 22.

Controller 20 also includes a microprocessor 34. Microprocessor 34 is responsible for commanding the switchable control of current through electrical load 22. Microprocessor 34 runs an appropriate control algorithm stored in memory to determine when current should and should not be provided through electrical load 22 (that is, when electrical load 22 should be turned ON and OFF). Microprocessor 34 includes a pin or terminal 36. Terminal 36 can be configured under software control as an output or as an input. If configured as an output, terminal 36 can actively drive node 38 to a logic HIGH level (for example, approximately 5 volts) and to a logic LOW level (for example, approximately zero volts). If configured as an input, terminal 36 assumes a high-impedance state in which microprocessor 34 monitors the logic level of the voltage at terminal 36. An example of a microprocessor having a pin which can be so alternately configured as an input or an output is the 68HC11 from Motorola Corporation.

Controller 20 also includes field effect transistor (FET) 40. Drain 42 of transistor 40 is coupled to the low side of electrical load 22. Source 44 of transistor 40 is coupled to ground. Transistor 40 is thus configured to control current from circuit 28 through electrical load 22 to ground. Gate 46 of transistor 40 is coupled via a low-pass filter comprising resistor 48 and capacitor 50, to terminal 36 of microprocessor 34. Thus, when terminal 36 of microprocessor 34 is configured as an output, microprocessor 34 has the capability to turn transistor 40 ON and OFF, respectively turning current through electrical load 22 ON and OFF. In the OFF state, the only current which flows between drain 42 and source 44 is "leakage" current, which is generally extremely insubstantial.

Also provided in controller 20 is p-n-p transistor 60. Emitter 62 of transistor 60 is coupled via diode 63 to terminal 30 of controller 20. It can be seen that emitter 62 is thus coupled to the high side of electrical load 22. Collector 64 is coupled via resistor 65 to ground and via resistor 67 to node 38. Base 66 is coupled via a resistor 68 to the low side of electrical load 22. Diode 63 helps to protect transistor 60 from reverse base-emitter voltage if an inductive voltage spike occurs across electrical load 22.

Further provided in controller 20 is diode 70, which is coupled to logic supply voltage $V_{logic}$ (for example, five volts) and to node 38.

The system of the FIGURE operates as follows. If microprocessor 34 decides according to its algorithm for electrical load 22 that electrical load 22 should be ON, microprocessor 34 will configure terminal 36 as an output and will drive node 38 to a logic HIGH level. This will cause gate 46 of transistor 40 to also go HIGH, after a delay determined by the R-C time constant defined by resistor 48 and capacitor 50. Once gate 46 goes HIGH, transistor 40 turns on, pulling drain 42 down and consequently causing current to flow through electrical load 22. Electrical load 22 is thus turned ON. The current flowing through electrical load 22 flows into terminal 32 and then predominantly into drain 42 of transistor 40. Thus, the current flows substantially in series through electrical load 22, terminal 32 and drain 42.

After turning electrical load 22 ON, microprocessor 34 then reconfigures terminal 36 as an input, terminal 36 thus assuming a high-impedance state. Although in this high-impedance state microprocessor 34 no longer actively holds node 38 HIGH, node 38 remains latched HIGH, as will now be explained. When electrical load 22 is ON, a relatively large voltage (approximately 12 volts) exists across electrical load 22. This same large voltage (less a diode drop due to diode 63) appears across emitter 62 and base 66 of transistor 60. Because emitter 62 is at a higher voltage than base 66, transistor 60 turns ON. Assuming resistor 68 is chosen to provide a large base current for transistor 60, transistor 60 will be strongly in its saturation region. Collector 64 of transistor 60 will thus assume approximately the same voltage as emitter 62, about one diode drop below the nominal 12 volts at circuit 28. Because collector 64 is thus at a nominal voltage in the area of 11 volts, node 38 will be held at a logic HIGH level (actually being clamped at one diode drop above $V_{logic}$ by diode 70). Thus, despite the fact that microprocessor 34 no longer actively holds node 38 high, node 38 remains "latched" high. Thus, gate 46 of transistor 40 remains HIGH, causing transistor 40 and electrical load 22 to remain ON.

If microprocessor 34 subsequently decides according to its control algorithm that electrical load 22 should be OFF, microprocessor 34 once again configures terminal 36 as an output. This time, however, microprocessor 34 drives node 38 LOW. This forces gate 46 of transistor 40 LOW, after the delay provided by the R-C time constant attributable to resistor 48 and capacitor 50. Transistor 40 thus turns OFF, turning OFF electrical load 22.

At this point, one advantage of the system of the FIGURE can be highlighted. If the impedance of electrical load 22 has a significant inductive component, the delay in turning electrical load 22 OFF caused by the R-C time constant of resistor 48 and capacitor 50 will reduce the inductive voltage spike appearing across electrical load 22. This "flyback protection" enhances the long-term durability of transistor 40, whose durability might otherwise be adversely affected by such inductive voltage spikes across electrical load 22.

The short circuit protection function of the system of the FIGURE will now be described. Assume that microprocessor 34 has turned ON electrical load 22 as described above and has subsequently configured terminal 36 as an input, also as described above. The reader will recall that electrical load 22 will remain latched ON. If a short circuit fault 80 exists such that battery voltage appears at the low side of electrical load 22, transistor 40 would overdissipate absent the short circuit protection function which will next be described. Such overdissipation would be due to transistor 40 continuing to try to pull drain 42 low, despite the low-source-impedance short circuit 80 at drain 42.

If such a short circuit 80 appears at the low side of electrical load 22, the voltage across electrical load 22 will drop to essentially zero volts. (Recall that the high side of electrical load 22 is coupled to battery voltage via circuit 28.) This voltage will be insufficient to bias transistor 60 into remaining in its ON state. With transistor 60 turning OFF, collector 64 of transistor 60 will be pulled to ground by resistor 65. Thus, after a delay defined the by R-C time constant defined by capacitor 50 and the series combination of resistors 65, 67 and 48, transistor 40 will turn OFF. The time constant is selected to be short enough to cause transistor 40 to turn off before a serious period of overdissipation occurs.

With terminal 36 of microprocessor 34 configured as an input, microprocessor 34 can monitor the voltage at node 38. Microprocessor 34 can thus take appropriate action when it sees the voltage at node 38 go LOW due to the short-circuit protection function having turned transistor 60 OFF. For example, microprocessor 34 can generate a malfunction code to be stored in memory for later retrieval by a service technician. Also, microprocessor 34 can cause the lighting of a lamp on the instrument panel of the vehicle to inform the vehicle's driver of the detected malfunction. Further, because the short-circuit fault might be intermittent, microprocessor 34 can periodically try to turn transistor 40 back ON.

It should be noted that terminal 36 of microprocessor 34 can be one whose high-impedance state is not an input state, but merely an inactive state (a so-called "tri-state"). In such a case, the short-circuit protection described herein will still be effective. However, microprocessor 34 will not have the ability to diagnose the condition as was described in the preceding paragraph.

Various other modifications and variations will no doubt occur to those skilled in the arts to which this invention pertains. Such variations which generally rely on the teachings through which this disclosure has advanced the art are properly considered within the scope of this invention. This disclosure should thus be considered illustrative, not limiting; the scope of the invention is instead defined by the following claims.

What is claimed is:

1. A short circuit protection system comprising:

a first terminal and a second terminal;

a first transistor coupled to said second terminal, said first transistor having an OFF state in which substantially no current flows in series through said second terminal and said first transistor and an ON state in which current flows substantially in series through said second terminal and said first transistor;

a microprocessor having a microprocessor terminal configurable as an output and alternatively configurable to have a high-impedance state, wherein said first transistor is controllably coupled to said microprocessor terminal;

a second transistor coupled substantially across said first and second terminals and further controllingly coupled to said first transistor, whereby said second transistor is responsive to a voltage across said first and second terminals to force said first transistor OFF if said voltage across said first and second terminals is less than a predetermined value, said first transistor is ON and said microprocessor terminal is configured to have said high-impedance state, and to hold said first transistor ON if said voltage across said first and second terminals is greater than said predetermined value, said first transistor is ON and said microprocessor terminal is configured to have said high-impedance state.

2. A short circuit protection system as recited in claim 1, wherein said high-impedance state of said microprocessor terminal is an input state.

3. A short circuit protection system as recited in claim 1, further comprising a low-pass filter coupled between said microprocessor terminal and said first transistor.

4. A short circuit protection system as recited in claim 2, further comprising a low-pass filter coupled between said microprocessor terminal and said first transistor.

5. A short circuit protection system as recited in claim 4, further comprising an electrical load coupled across said first and second terminals.

6. A short circuit protection system as recited in claim 5, wherein said electrical load has a relatively higher voltage side and a relatively lower voltage side, said relatively higher voltage side coupled to said first terminal and said relatively lower voltage side coupled to said second terminal.

7. A short circuit protection system as recited in claim 6, wherein said electrical load has an impedance with a significant inductive component.

8. A short circuit protection system as recited in claim 7, wherein said low-pass filter is designed to slow switching of said electrical load by said first transistor sufficiently to substantially attenuate inductive spikes generated by switching of said electrical load by said first transistor.

9. A short circuit protection system comprising:

an electrical load;

a first transistor coupled to said electrical load, said first transistor having an OFF state in which substantially no current flows through said electrical load and an ON state in which current flows substantially in series through said electrical load and said first transistor;

a microprocessor having a microprocessor terminal configurable as an output and alternatively configurable to have a high-impedance state, wherein said first transistor is controllably coupled to said microprocessor terminal;

a second transistor coupled substantially across said electrical load and further controllingly coupled to said first transistor, said second transistor responsive to a voltage across said electrical load to force said first transistor OFF if said voltage across said electrical load is less than a predetermined value, said first transistor is ON and said microprocessor terminal is configured to have said high-impedance state, and to hold said first transistor ON if said voltage across said electrical load is greater than said predetermined value, said first transistor is ON and said microprocessor terminal is configured to have said high-impedance state.

10. A short circuit protection system as recited in claim 9, wherein said high-impedance state is an input state.

11. A short circuit protection system as recited in claim 9, further comprising a low-pass filter coupled between said microprocessor terminal and said first transistor.

12. A short circuit protection system as recited in claim 11, wherein said electrical load has an impedance having a significant inductive component.

13. A short circuit protection system as recited in claim 9, wherein said electrical load has a relatively high-voltage side and a relatively-low voltage side and wherein said relatively low-voltage side is coupled to said first transistor.

14. A short circuit protection system as recited in claim 12, wherein said high-impedance state is an input state.

15. A short circuit protection system as recited in claim 14, wherein said electrical load has a relatively high-voltage side and a relatively low-voltage side and wherein said relatively low-voltage side is coupled to said first transistor.

16. A short circuit protection system as recited in claim 15, further comprising a low-pass filter coupled between said microprocessor terminal and said first transistor.

17. A short circuit protection system as recited in claim 11, wherein said low-pass filter is designed to slow switching of said electrical load by said first transistor sufficiently to substantially attenuate inductive spikes generated by switching of said electrical load by said first transistor.

* * * * *